(12) United States Patent
Toda et al.

(10) Patent No.: US 12,215,417 B2
(45) Date of Patent: Feb. 4, 2025

(54) SUBSTRATE PROCESSING METHOD AND SUBSTRATE PROCESSING DEVICE

(71) Applicant: TOKYO ELECTRON LIMITED, Tokyo (JP)

(72) Inventors: Satoshi Toda, Nirasaki (JP); Tetsuro Takahashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 387 days.

(21) Appl. No.: 17/701,341

(22) Filed: Mar. 22, 2022

(65) Prior Publication Data
US 2022/0213596 A1 Jul. 7, 2022

Related U.S. Application Data

(62) Division of application No. 16/092,683, filed as application No. PCT/JP2017/008590 on Mar. 3, 2017, now abandoned.

(30) Foreign Application Priority Data

Apr. 15, 2016 (JP) ................. 2016-081682

(51) Int. Cl.
*C23C 16/455* (2006.01)
*C23C 16/44* (2006.01)
(Continued)

(52) U.S. Cl.
CPC .... *C23C 16/45502* (2013.01); *C23C 16/4412* (2013.01); *C23C 16/455* (2013.01);
(Continued)

(58) Field of Classification Search
None
See application file for complete search history.

(56) References Cited

U.S. PATENT DOCUMENTS 5,639,309 A 6/1997 Akimoto
5,855,681 A 1/1999 Maydan et al.
(Continued)

FOREIGN PATENT DOCUMENTS

JP 2003-49278 A 2/2003
JP 2010-080924 A 4/2010
(Continued)

*Primary Examiner* — Binh X Tran
(74) *Attorney, Agent, or Firm* — Nath, Goldberg & Meyer; Jerald L. Meyer; Tanya E. Harkins

(57) ABSTRACT

A predetermined process is performed on two target substrates using a substrate processing device that includes two processing parts for performing a substrate process on each of the two target substrates, a gas supply mechanism for separately supplying gases to the two processing parts, and a common exhaust mechanism for collectively exhausting the gases inside the two processing parts. A first mode is executed in which an HF gas and an $NH_3$ gas are supplied to one of the two processing parts, and the HF gas is not supplied to the other of the two processing parts. Subsequently, a second mode is executed in which the HF gas and the $NH_3$ gas are supplied to the two processing parts under the same gas conditions. In the first mode, a pressure difference is prevented from occurring between the two processing parts.

12 Claims, 8 Drawing Sheets

(51) Int. Cl.
*C23C 16/52* (2006.01)
*C23F 1/08* (2006.01)
*H01L 21/306* (2006.01)
*H01L 21/311* (2006.01)

(52) U.S. Cl.
CPC ............... *C23C 16/52* (2013.01); *C23F 1/08* (2013.01); *H01L 21/306* (2013.01); *H01L 21/31111* (2013.01)

(56) References Cited

U.S. PATENT DOCUMENTS

| | | | |
|---|---|---|---|
| 6,077,157 A | 6/2000 | Fairbairn et al. | |
| 6,495,233 B1 | 12/2002 | Shmurun et al. | |
| 6,962,644 B2 | 11/2005 | Paterson et al. | |
| 7,276,122 B2 | 10/2007 | Devine et al. | |
| 8,366,829 B2 | 2/2013 | Yin et al. | |
| 10,460,949 B2 | 10/2019 | Takahashi et al. | |
| 2003/0085205 A1 | 5/2003 | Lai et al. | |
| 2010/0193132 A1* | 8/2010 | Wi | H01L 21/6719 118/719 |
| 2011/0031214 A1* | 2/2011 | Kim | H01L 21/68785 156/345.26 |
| 2014/0033978 A1 | 2/2014 | Adachi et al. | |
| 2016/0027672 A1* | 1/2016 | Asakawa | H01L 21/68785 156/345.37 |
| 2016/0111304 A1* | 4/2016 | Takahashi | C23C 16/52 156/345.26 |

FOREIGN PATENT DOCUMENTS

| | | |
|---|---|---|
| JP | 2011-529136 A | 12/2011 |
| KR | 10-0275807 B1 | 12/2000 |
| KR | 10-0300096 B1 | 11/2001 |
| KR | 10-2011-0099321 A | 9/2011 |

\* cited by examiner (Reference example)

SUBSTRATE PROCESSING METHOD AND SUBSTRATE PROCESSING DEVICE

This is a Divisional Application of U.S. patent application Ser. No. 16/092,683, filed Oct. 10, 2018, an application filed as a national stage under 371 of Application No. PCT/JP2017/008590, filed Mar. 3, 2017 and claiming benefit from Japanese Application No. 2016-081682, filed Apr. 15, 2016, the content of each of which is hereby incorporated by reference in its entirety.

TECHNICAL FIELD

The present disclosure relates to a substrate processing method and a substrate processing device for processing a process on a target substrate.

BACKGROUND

Semiconductor devices are manufactured by repeatedly performing various processes such as an etching process, a film-forming process and the like, on a semiconductor wafer (hereinafter simply referred to as a wafer) which is a target substrate.

As an apparatus for performing such a substrate process, a single wafer type processing apparatus for processing target substrates one by one has been conventionally widely used. However, such a processing apparatus is required to increase throughput, and a processing apparatus for performing the substrate process on two or more target substrates at a time while maintaining the platform of the single wafer type processing apparatus has also been used (see, e.g., Patent Document 1).

In the substrate processing device disclosed in Patent Document 1, a substrate mounting table on which a plurality of target substrates is mounted is installed inside a chamber. A plurality of process regions and a plurality of separation regions that separates the plurality of process regions from each other are alternately defined above the substrate mounting table along a circumferential direction of the substrate mounting table. In the substrate process, the substrate mounting table is rotated such that the plurality of target substrates pass through the regions in the order of "process region separation region process region separation region, . . . ". In this way, the plurality of target substrates is processed under different gas conditions.

PRIOR ART DOCUMENTS

Patent Documents

Patent Document 1: Japanese laid-open publication No. 2010-080924

In the substrate processing device disclosed in Patent Document 1, in order to process the plurality of target substrates under the different gas conditions, exhaust mechanisms are separately installed for the process regions independently of each other. This increases the manufacturing costs of the substrate processing device.

SUMMARY

The present disclosure provides some embodiments of a substrate processing method and a substrate processing device, which are capable of performing a substrate process on a plurality of target substrates under different gas conditions with high precision using a common exhaust mechanism, when processing the plurality of target substrates by a plurality of processing parts.

According to a first aspect of the present disclosure, there is provided a substrate processing method for performing a predetermined process on a plurality of target substrates under a vacuum atmosphere using a substrate processing device that includes a plurality of processing parts for performing a substrate process on each of the plurality of target substrates, a gas supply mechanism for separately supplying gases to the plurality of processing parts, and a common exhaust mechanism for exhausting the gases inside the plurality of processing parts in a collective manner. The method includes: performing a first mode in which a first gas is supplied to a portion of the plurality of processing parts and a second gas different from the first gas is supplied to another portion of the plurality of processing parts, while controlling the common exhaust mechanism so as to exhaust a processing gas in common from the plurality of processing parts; and subsequently, performing a second mode in which the first gas as the processing gas is supplied to all of the plurality of processing parts under the same gas conditions, while exhausting the processing gas from the plurality of processing parts in a collective manner by the common exhaust mechanism, wherein, in the first mode, a pressure difference is prevented from occurring between the plurality of processing parts.

In the first aspect, when performing the first mode, an amount of the second gas supplied to the another portion of the plurality of processing parts may be controlled so as to prevent the pressure difference from occurring between the portion of the plurality of processing parts and the another portion of the plurality of processing parts.

At least one of an inert gas and a non-reactive gas that is not reactive with the plurality of target substrates may be used as the second gas. Further, when performing the first mode, in the portion of the plurality of processing parts, the substrate process using the first gas which is the processing gas for the plurality of target substrates may be performed; and in the another portion of the plurality of processing parts, the substrate process may not be performed by supplying the second gas as a supplement gas instead of supplying the first gas which is the processing gas for the plurality of target substrates.

In this case, the method may further include, prior to the performing the first mode, stabilizing pressures of the plurality of processing parts by regulating the pressures of the plurality of processing parts with a pressure regulating gas. When stabilizing the pressures, a flow rate of the pressure regulating gas may be set to a level at which the first gas used as the processing gas and the second gas used as the supplement gas are suppressed from backwardly diffusing between the plurality of processing parts, and a flow of the pressure regulating gas toward the common exhaust mechanism is formed, in the first mode of the substrate process. A portion of the gases supplied during the substrate process, which is not used for the substrate process, may be used as the pressure regulating gas, and the flow rate of the pressure regulating gas in the stabilizing pressures may be set to be larger than a flow rate of the pressure regulating gas used in the substrate process. The flow rate of the pressure regulating gas in the stabilizing pressures may be set to be three times or more the flow rate of the pressure regulating gas used in the substrate process.

In some embodiments, a dilution gas for diluting the first gas may be used as the second gas.

According to a second aspect of the present disclosure, there is provided a substrate processing method for performing a predetermined process on a plurality of target substrates under a vacuum atmosphere using a substrate processing device that includes a plurality of processing parts for performing a substrate process on each of the plurality of target substrates, a gas supply mechanism for separately supplying gases to the plurality of processing parts, and a common exhaust mechanism for exhausting the gases inside the plurality of processing parts in a collective manner. The method includes: performing a first mode in which an HF gas and an NH$_3$ gas as processing gases are supplied to a portion of the plurality of processing parts so as to perform an etching process, and instead of the HF gas, at least one of an inert gas and a non-reactive gas which is not reactive with the plurality of target substrates is supplied to another portion of the plurality of processing parts so as not to perform the etching process, while controlling the common exhaust mechanism so as to exhaust the processing gases in common from the plurality of processing parts; and subsequently, performing a second mode in which the HF gas and the NH$_3$ gas as the processing gases are supplied to all of the plurality of processing parts so as to perform the etching process, while exhausting the processing gases from the plurality of processing parts in a collective manner by the common exhaust mechanism, wherein, in the first mode, the supply of the gases is performed to prevent a pressure difference from occurring between the plurality of processing parts.

In the second aspect, when performing the first mode, the HF gas and the NH$_3$ gas as the processing gases and the inert gas may be supplied to the portion of the plurality of processing parts, and supplying the inert gas or the inert gas and the NH$_3$ gas to the another portion of the plurality of processing parts. The inert gas may be used as a supplement gas for regulating pressures of the portion of the plurality of processing parts and the another portion of the plurality of processing parts.

In some embodiments, the method may further include, prior to the performing a first mode, stabilizing pressures of the plurality of processing parts by regulating the pressures of the plurality of processing parts with the inert gas or the inert gas and the NH$_3$ gas as pressure regulating gases. When stabilizing the pressures, flow rates of the pressure regulating gases may be set to a level at which the processing gases and the inert gas are suppressed from backwardly diffusing between the plurality of processing parts, and a flow of the pressure regulating gases toward the common exhaust mechanism is formed, in the first mode of the substrate process. The flow rates of the pressure regulating gases in the stabilizing pressures may be set to be larger than flow rates of the pressure regulating gases used in the substrate process. The flow rates of the pressure regulating gases in the stabilizing pressures may be set to be three times or more the flow rates of the pressure regulating gases used in the substrate process.

According to a third aspect of the present disclosure, there is provided a substrate processing device for performing a predetermined process on a plurality of target substrates under a vacuum atmosphere, including: a plurality of processing parts, each of which configured to perform a substrate process on each of the plurality of target substrates; a gas supply mechanism configured to separately supply processing gases to the plurality of processing parts; a common exhaust mechanism configured to exhaust the processing gases inside the plurality of processing parts in a collective manner; and a controller configured to control the gas supply mechanism and the common exhaust mechanism to execute the substrate process on the plurality of target substrates in a sequence of first and second modes, wherein the first mode involves supplying a first gas to a portion of the plurality of processing parts and supplying a second gas different from the first gas to another portion of the plurality of processing parts, while controlling the common exhaust mechanism so as to exhaust the processing gas in common from the plurality of processing parts, and the second mode involves supplying the first gas as the processing gases to all of the plurality of processing parts under the same gas conditions, while exhausting the processing gases from the plurality of processing parts in a collective manner by the common exhaust mechanism, wherein, in the first mode, the controller controls such that a pressure difference is prevented from occurring between the plurality of processing parts.

According to a fourth aspect of the present disclosure, there is provided a substrate processing device for performing a predetermined process on a plurality of target substrates under a vacuum atmosphere, including: a plurality of processing parts, each of which configured to perform a substrate process on each of the plurality of target substrates; a gas supply mechanism configured to separately supply processing gases to the plurality of processing parts; a common exhaust mechanism configured to exhaust the processing gases inside the plurality of processing parts in a collective manner; and a controller configured to control the gas supply mechanism and the common exhaust mechanism to execute the substrate process on the plurality of target substrates in a sequence of first and second modes, wherein the first mode involves supplying an HF gas and an NH$_3$ gas as the processing gases to a portion of the plurality of processing parts so as to perform an etching process, and instead of the HF gas, supplying at least one of an inert gas and a non-reactive gas which is not reactive with the plurality of target substrates to another portion of the plurality of processing parts so as not to perform the etching process, while controlling the common exhaust mechanism so as to exhaust the processing gases in common from the plurality of processing parts; and the second mode involves supplying the HF gas and the NH$_3$ gas as the processing gases to all of the plurality of processing parts so as to perform the etching process, while exhausting the processing gases from the plurality of processing parts in a collective manner by the common exhaust mechanism, wherein the controller controls in the first mode such that the supply of the gases is performed to prevent a pressure difference from occurring between the plurality of processing parts.

According to a fifth aspect of the present disclosure, there is provided a storage medium storing a program that operates on a computer and controls a substrate processing device that includes a plurality of processing parts for performing a substrate process on each of a plurality of target substrates, a gas supply mechanism for separately supplying gases to the plurality of processing parts, and a common exhaust mechanism for exhausting the gases inside the plurality of processing parts in a collective manner, wherein the program, when executed, causes the computer to control the substrate processing device so as to perform a substrate processing method. The method includes: performing a first mode in which a first gas is supplied to a portion of the plurality of processing parts and a second gas different from the first gas is supplied to another portion of the plurality of processing parts, while controlling the common exhaust mechanism so as to exhaust a processing gas in common from the plurality of processing parts; and subsequently, performing a second mode in which the first gas as the processing gas is supplied to all of the plurality of processing parts under the same gas conditions, while exhausting the processing gas from the plurality of processing parts in a collective manner by the common exhaust mechanism, wherein, in the first mode, a pressure difference is prevented from occurring between the plurality of processing parts.

According to the present disclosure, it is possible to perform a substrate process on a plurality of target substrates under different gas conditions with high precision using a common exhaust mechanism, when processing the plurality of target substrates by a plurality of processing parts.

DETAILED DESCRIPTION

Embodiments of the present disclosure will now be described in detail with reference to the accompanying drawings.

<Substrate Processing Device>

Figure 1:
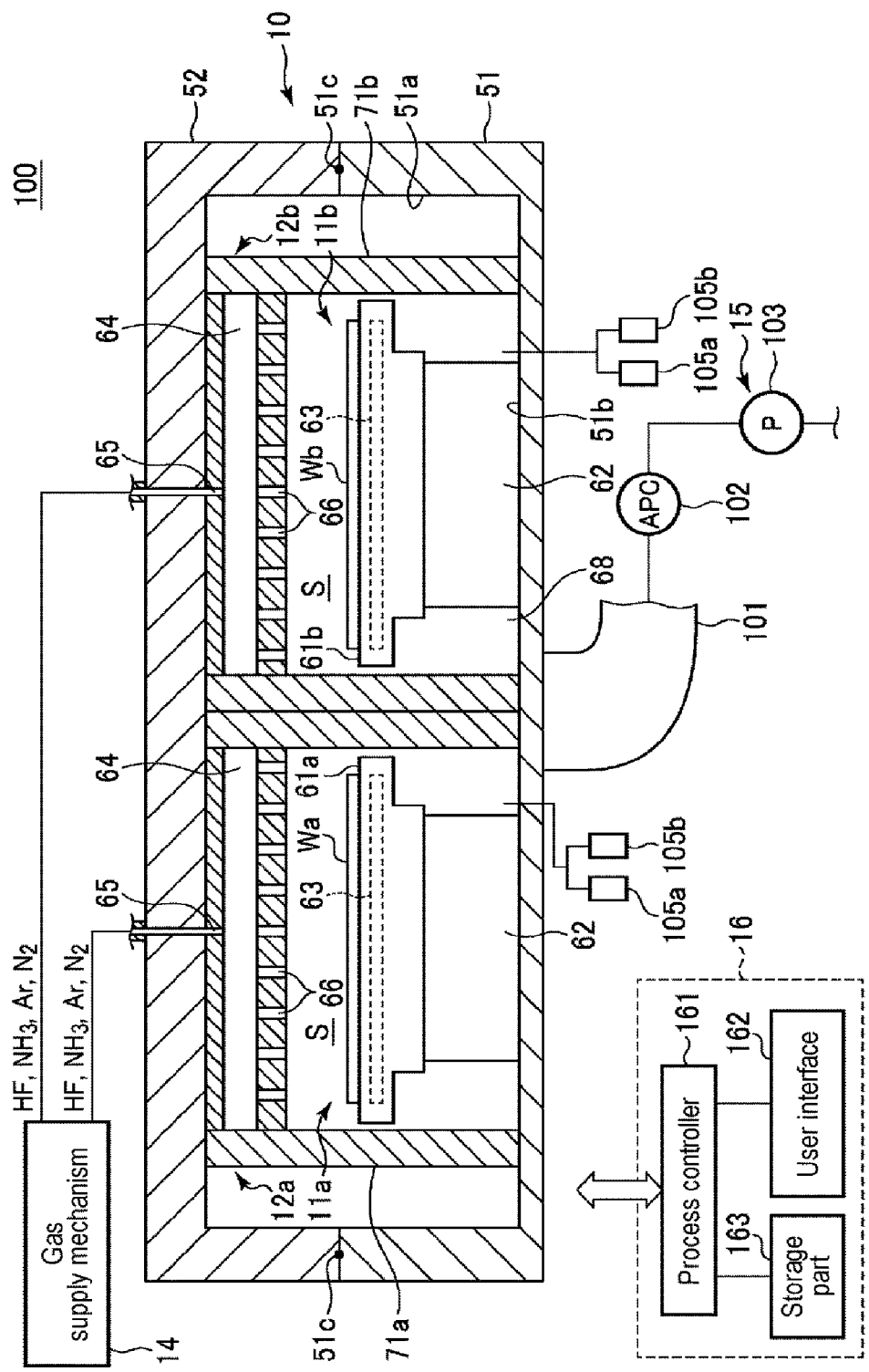
FIG. 1 is a sectional view illustrating an example of a substrate processing device according to an embodiment of the present disclosure.

FIG. 1 is a sectional view illustrating an example of a substrate processing device according to an embodiment of the present disclosure. In this example, a COR processing apparatus which performs a chemical oxide removal (COR) process (etching process) will be described as the substrate processing device.

A typical example of the COR process is a substrate process of supplying a gas including an HF gas and a gas including an $NH_3$ gas onto an oxide film existing on a surface of a substrate such as a silicon wafer inside a chamber, thus removing the oxide film from the surface of the silicon wafer.

As illustrated in FIG. 1, a COR processing apparatus 100 includes a hermetically sealed chamber 10. The chamber 10 is made of, for example, aluminum or an aluminum alloy, and includes a chamber main body 51 and a lid 52. The chamber main body 51 includes a lateral wall portion 51a and a bottom portion 51b. An upper portion of the chamber main body 51 is opened and closed by the lid 52. The lateral wall portion 51a and the lid 52 are sealed by a seal member 51c to secure the airtightness of the chamber 10.

Two processing parts 11a and 11b for performing a substrate process on a plurality of target substrates are installed inside the chamber 10. The two processing parts 11a and 11b include substrate mounting tables 61a and 61b, respectively. Wafers Wa and Wb as target substrates are mounted on the respective substrate mounting tables 61a and 61b in a horizontal posture. Gas introduction members 12a and 12b for introducing a processing gas into the chamber 10 are installed above the substrate mounting tables 61a and 61b, respectively. The gas introduction members 12a and 12b are installed inward of the lid 52. The gas introduction member 12a and the substrate placing table 61a face each other, and the gas introduction member 12b and the substrate placing table 61b face each other. A cylindrical inner wall 71a is installed so as to surround the gas introduction member 12a and the substrate mounting table 61a, and a cylindrical inner wall 71b is installed so as to surround the gas introduction member 12b and the substrate mounting table 61b. The inner walls 71a and 71b are installed to extend from the inner side of an upper wall of the lid 52 to the bottom portion 51b of the chamber main body 51. Upper portions of the inner walls 71a and 71b constitute lateral walls of the gas introduction members 12a and 12b, respectively. A space between the gas introduction member 12a and the substrate mounting table 61a and a space between the gas introduction member 12b and the substrate mounting table 61b are substantially sealed by the inner walls 71a and 71b, respectively. These spaces constitute process spaces S in which the wafers Wa and Wb are subjected to the substrate process, respectively.

A gas supply mechanism 14 for supplying a gas to each of the gas introduction members 12a and 12b, an exhaust mechanism 15 for exhausting the interior of the chamber 10, and a control part 16 for controlling the COR processing apparatus 100 are installed outside the chamber 10. A loading/unloading port (not shown) through which the wafer W is loaded into and unloaded is formed in the lateral wall portion 51a of the chamber main body 51. The loading/unloading port can be opened and closed by a gate valve (not shown). A loading/unloading port (not shown) is also formed in each of the inner walls 71a and 72b and can be opened and closed by a shutter (not shown).

Each of the processing parts 1a and 11b has substantially a circular shape. Each of the substrate mounting tables 61a and 61b is supported by a base block 62. The base block 62 is fixed to the bottom portion 51b of the chamber main body 51. A temperature regulator 63 for regulating a temperature of the wafer W is installed inside each of the substrate mounting tables 61a and 61b. The temperature regulator 63 is provided with a pipeline through which, for example, a temperature regulating medium (for example, water) circulates. By heat exchange with the temperature regulating medium flowing in the pipeline, the temperature of the wafer W is controlled. In addition, a plurality of lifting pins (not shown) used to transfer the wafer W are installed in the substrate mounting tables 61a and 61b so as to be moved upward and downward on a wafer mounting surface.

The gas supply mechanism 14 supplies a processing gas, such as an HF gas or an $NH_3$ gas, and an inert gas (dilution gas), such as an Ar gas or a $N_2$ gas, to the processing parts 11a and 11b via the gas introduction members 12a and 12b, respectively. The gas supply mechanism 14 includes gas supply sources, supply pipes, valves, flow rate controllers represented by mass flow controllers and so on, which correspond to the respective gases.

Figure 2:
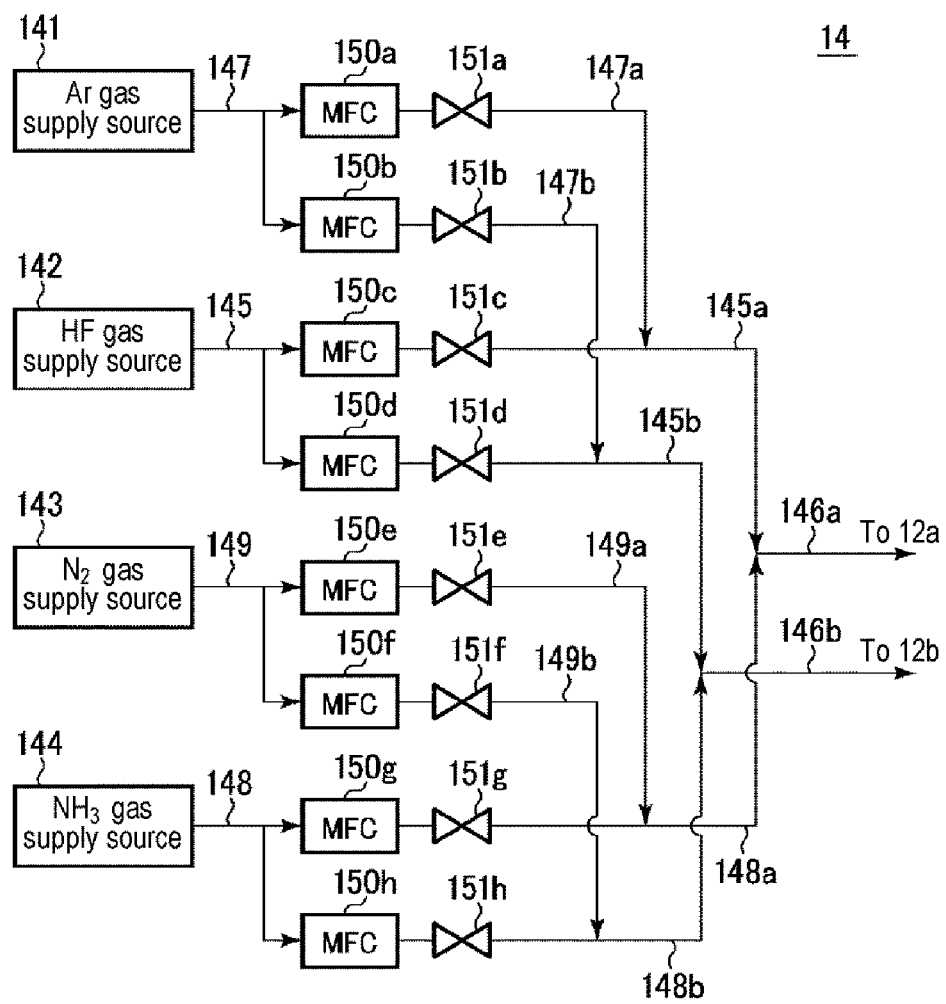
FIG. 2 is a system configuration view illustrating a configuration example of a gas supply mechanism.

FIG. 2 is a system configuration view illustrating an example of a system configuration of the gas supply mechanism 14. As illustrated in FIG. 2, the gas supply mechanism 14 includes an Ar gas supply source 141, an HF gas supply source 142, an $N_2$ gas supply source 143 and an $NH_3$ gas supply source 144 as the gas supply sources.

In this example, the HF gas supplied from the HF gas supply source 142 is diluted with an Ar gas supplied from the Ar gas supply source 141 and then supplied to the gas introduction members 12*a* and 12*b*. Likewise, the $NH_3$ gas supplied from the $NH_3$ gas supply source 144 is also diluted with the $N_2$ gas supplied from the $N_2$ gas supply source 143 and then supplied to the gas introduction members 12*a* and 12*b*.

An HF gas supply pipe 145 through which the HF gas flows is branched into two HF gas supply pipes 145*a* and 145*b* which are respectively connected to a supply pipe 146*a* connected to the gas introduction member 12*a* and a supply pipe 146*b* connected to the gas introduction member 12*b*. An Ar gas supply pipe 147 through which the Ar gas flows is branched into two Ar gas supply pipes 147*a* and 147*b* which are respectively connected to the HF gas supply pipes 145*a* and 145*b*. Thus, the HF gas can be diluted with the Ar gas.

Similarly, an $NH_3$ gas supply pipe 148 through which the $NH_3$ gas flows is branched into two $NH_3$ gas supply pipes 148*a* and 148*b* which are respectively connected to the supply pipes 146*a* and 146*b*. A $N_2$ gas supply pipe 149 through which the $N_2$ gas flows is branched into two $N_2$ gas supply pipes 149*a* and 149*b* which are respectively connected to the $NH_3$ gas supply pipes 148*a* and 148*b*. Thus, the $NH_3$ gas can be diluted with the $N_2$ gas.

In addition to being used as dilution gases, the Ar gas and the $N_2$ gas are also used as a purge gas or as a supplement gas for pressure regulation to be described later.

Mass flow controllers (MFCs) 150*a* to 150*h* and opening/closing valves 151*a* to 151*h* for opening/closing the respective supply pipes are respectively installed in the HF gas supply pipes 145*a* and 145*b*, the Ar gas supply pipes 147*a* and 147*b*, the $NH_3$ gas supply pipes 148*a* and 148*b*, and the $N_2$ gas supply pipes 149*a* and 149*b*. The MFCs 150*a* to 150*h* and the opening/closing valves 151*a* to 151*h* can be controlled by the control part 16 independently of each other.

For example, in the case of performing the normal COR process in the two processing parts 11*a* and 11*b*, both the HF gas and the $NH_3$ gas are supplied to each of the gas introduction members 12*a* and 12*b*. In this case, the control part 16 controls all the opening/closing valves to be opened, as shown in the following "Case a".

[Case a]
Supply System to Gas Introduction Member 12*a*

| | |
|---|---|
| Opening/closing valve 151*a* (Ar) | Opened |
| Opening/closing valve 151*c* (HF) | Opened |
| Opening/closing valve 151*e* ($N_2$) | Opened |
| Opening/closing valve 151*g* ($NH_3$) | Opened |

Supply System to Gas Introduction Member 12*b*

| | |
|---|---|
| Opening/closing valve 151*b* (Ar) | Opened |
| Opening/closing valve 151*d* (HF) | Opened |
| Opening/closing valve 151*f* ($N_2$) | Opened |
| Opening/closing valve 151*h* ($NH_3$) | Opened |

On the other hand, the opening/closing valves may be controlled such that conditions of gases to be supplied to the processing parts 11*a* and 11*b* via the gas introduction members 12*a* and 12*b* are different from each other. For example, the opening/closing valves may be controlled as shown in the following "Case b" and "Case c".

[Case b]
Supply System to Gas Introduction Member 12*a*

| | |
|---|---|
| Opening/closing valve 151*a* (Ar) | Opened |
| Opening/closing valve 151*c* (HF) | Opened |
| Opening/closing valve 151*e* ($N_2$) | Opened |
| Opening/closing valve 151*g* ($NH_3$) | Opened |

Supply System to Gas Introduction Member 12*b*

| | |
|---|---|
| Opening/closing valve 151*b* (Ar) | Opened |
| Opening/closing valve 151*d* (HF) | Closed |
| Opening/closing valve 151*f* ($N_2$) | Opened |
| Opening/closing valve 151*h* ($NH_3$) | Closed |

[Case c]
Supply System to Gas Introduction Member 12*a*

| | |
|---|---|
| Opening/closing valve 151*a* (Ar) | Opened |
| Opening/closing valve 151*c* (HF) | Closed |
| Opening/closing valve 151*e* ($N_2$) | Opened |
| Opening/closing valve 151*g* ($NH_3$) | Closed |

Supply System to Gas Introduction Member 12*b*

| | |
|---|---|
| Opening/closing valve 151*b* (Ar) | Opened |
| Opening/closing valve 151*d* (HF) | Opened |
| Opening/closing valve 151*f* ($N_2$) | Opened |
| Opening/closing valve 151*h* ($NH_3$) | Opened |

That is to say, in Case b, from the state of Case a, the opening/closing valve 151*d* and the opening/closing valve 151*h* are closed to stop the supply of the HF gas and the $NH_3$ gas as processing gases and supply only the Ar gas and the Na gas to the gas introduction member 12*b*, and the HF gas and the $NH_3$ gas as the processing gases continue to be supplied to the gas introduction member 12*a*. Conversely, in Case c, the supply of the HF gas and the $NH_3$ gas to the gas introduction member 12*a* is stopped, and the HF gas and the $NH_3$ gas as the processing gases continue to be supplied to the gas introduction member 12*b*.

For this reason, in Case b, the HF gas and the $NH_3$ gas are supplied from the gas introduction member 12*a* to the processing part 11*a*, together with the Ar gas and the Na gas which are inert gases, respectively, while only the Ar gas and the Na gas which are inert gases are supplied from the gas introduction member 12*b* to the processing part 11*b*. Conversely, in Case c, the HF gas and the $NH_3$ gas are supplied from the gas introduction member 12*b* to the processing part 11*b*, together with the Ar gas and the Na gas which are inert gases, respectively, while only the Ar gas and the Na gas which are inert gases are supplied from the gas introduction member 12*a* to the processing part 11*a*. In this manner, during processing, it is possible to simultaneously supply the gases to the processing part 11a and the processing part 11b under different gas supply conditions. Substrate processing modes by the control of the valves will be described in detail later.

The gas introduction members 12a and 12b are provided to introduce the gases from the gas supply mechanism 14 into the chamber 10 and supply the gases to the processing parts 11a and 11b. Each of the gas introduction members 12a and 12b has a gas diffusion space 64 defined therein and has a cylindrical shape. Gas introduction holes 65 penetrating the upper wall of the chamber 10 are respectively formed in the upper surfaces of the gas introduction members 12a and 12b. A large number of gas discharge holes 66 connected to each of the gas diffusion spaces 64 are respectively formed in the bottom surfaces of the gas introduction members 12a and 12b. Gases such as the HF gas and the $NH_3$ gas supplied from the gas supply mechanism 14 reach the gas diffusion spaces 64 via the gas introduction holes 65, diffuse inside the gas diffusion spaces 64, and are uniformly discharged from the gas discharge holes 66 in the form of a shower. That is to say, each of the gas introduction members 12a and 12b functions as a gas dispersion head (shower head) that dispersedly discharges a gas. The gas introduction members 12a and 12b may be of a post-mix type in which the HF gas and the $NH_3$ gas are discharged into the chamber 10 through different flow paths.

The exhaust mechanism 15 includes an exhaust pipe 101 connected to an exhaust port (not shown) formed in the bottom portion 51b of the chamber 10. Further, the exhaust mechanism 15 includes an automatic pressure control valve (APC) 102 for controlling an internal pressure of the chamber 10 and a vacuum pump 103 for exhausting the interior of the chamber 10, which are installed in the exhaust pipe 101. The exhaust port is formed outside the inner walls 71a and 71b. A number of slits are formed in portions of the inner walls 71a and 71b below the substrate mounting tables 61a and 61b, respectively, so that the exhaust mechanism 15 can exhaust the interior of the chamber 10 from both the processing parts 11a and 11b. Thus, the interiors of the processing parts 11a and 11b are exhausted by the exhaust mechanism 15 at the same time. The APC 102 and the vacuum pump 103 are shared by both the processing parts 11a and 11b.

In addition, in order to measure the internal pressure of the chamber 10, a high-pressure capacitance manometer 105a and a low-pressure capacitance manometer 105b, which are pressure gauges, are installed so as to be inserted into the exhaust spaces 68 from the bottom portion 51b of the chamber 10, respectively. The opening degree of the automatic pressure control valve (APC) 102 is controlled based on a pressure detected by the capacitance manometer 105a or 105b.

The control part 16 includes a process controller 161 provided with a microprocessor (computer) for controlling various components of the COR processing apparatus 100. A user interface 162 is connected to the process controller 161. The user interface 162 includes a keyboard or a touch panel display for allowing an operator to input commands to manage the COR processing apparatus 100, a display for visualizing and displaying the operation status of the COR processing apparatus 100, and the like. In addition, a storage part 163 is connected to the process controller 161. The storage part 163 stores a control program for realizing various processes executed in the COR processing apparatus 100 under the control of the process controller 161, processing recipes which are control programs for causing the various components of the COR processing apparatus 100 to execute their respective prescribed processes according to processing conditions, various databases and the like. The processing recipes are stored in an appropriate storage medium (not shown) in the storage part 163. Then, as necessary, any of the processing recipes is called from the storage part 163 and is executed by the process controller 161, so that a desired process is performed in the COR processing apparatus 100 under the control of the process controller 161.

Further, in the present embodiment, the control part 16 has a significant feature in that the MFCs 150a to 150h and the opening/closing valves 151a to 151h of the gas supply mechanism 14 are independently controlled as described above.

<Substrate Processing Operation>

Figure 3A:
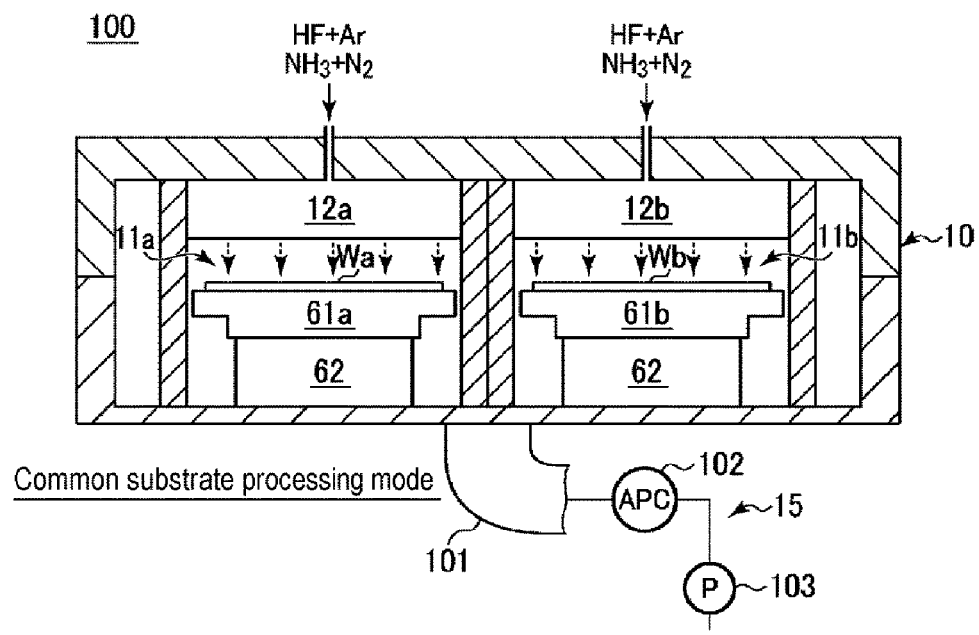
FIG. 3A is a sectional view for explaining a substrate processing operation in a common substrate processing mode by a COR processing apparatus according to an embodiment of the present disclosure.
Figure 3B:
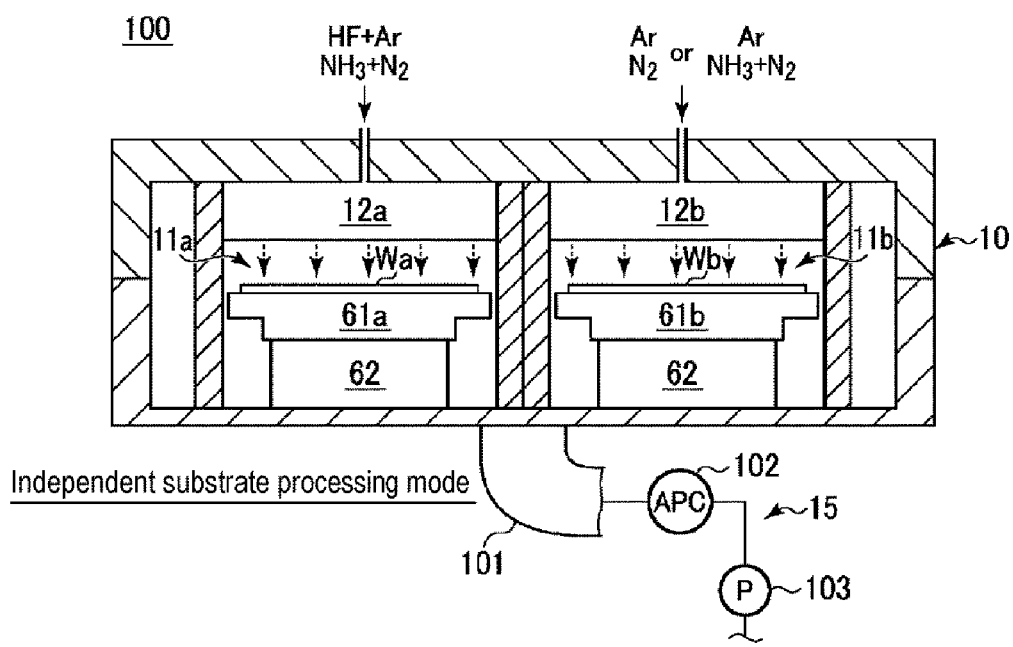
FIG. 3B is a sectional view for explaining a substrate processing operation in an independent substrate processing mode by the COR processing apparatus according to the embodiment of the present disclosure.

Next, a substrate processing operation performed by such a substrate processing device will be described. FIGS. 3A and 3B are sectional views for explaining a substrate processing operation performed by the COR processing apparatus 100 according to an embodiment.

Two wafers Wa and Wb on each of which an etching target film (for example, $SiO_2$ film) has been formed are respectively loaded into the processing parts 11a and 11b inside the chamber 10, and are respectively mounted on the substrate mounting tables 61a and 61b. Then, a pressure stabilizing step of stabilizing the internal pressure of the chamber 10 by adjusting the internal pressure to a predetermined pressure by means of the exhaust mechanism 15 is performed, and subsequently, a substrate process step is performed. Since the processing parts 11a and 11b share the exhaust mechanism 15, the pressure adjustment during the pressure stabilizing step and the substrate process step is performed by the common automatic pressure control valve (APC) 102.

The substrate process step is performed with a common substrate processing mode illustrated in FIG. 3A and an independent substrate processing mode illustrated in FIG. 3B.

(Common Substrate Processing Mode)

The common substrate processing mode is a mode in which the wafers Wa and Wb are processed under the same gas conditions. With this common substrate processing mode, a COR process is performed in both the processing parts 11a and 11b. In this mode, the state of the opening/closing valves 151a to 151h corresponds to "Case a" described above. Thus, as illustrated in FIG. 3A, the HF gas and the $NH_3$ gas respectively diluted with the Ar gas and the $N_2$ gas as inert gases are supplied from the gas introduction members 12a and 12b onto the wafers Wa and Wb, whereby the same substrate process is performed on both the wafers Wa and Wb.

(Independent Substrate Processing Mode)

The independent substrate processing mode is a mode in which the wafers Wa and Wb are processed under different gas conditions. In this mode, the state of the opening/closing valves 151a to 151h corresponds to, for example, "Case b" described above. Thus, as illustrated in FIG. 3B, the HF gas and the $NH_3$ gas respectively diluted with the Ar gas and the $N_2$ gas are supplied from the gas introduction member 12a onto the wafer Wa of the processing part 11a, and only the Ar gas and the $N_2$ gas are supplied from the gas introduction member 12b onto the wafer Wb of the processing part 11b, whereby different substrate processes are performed on the wafers Wa and Wb. That is to say, the processing of the wafer Wa by the HF gas and the $NH_3$ gas is continued in the processing part 11a, whereas the supply of the HF gas and the $NH_3$ gas onto the wafer Wb is stopped in the processing part 11b. At this time, only the HF gas may be stopped and the NH₃ gas may be supplied to the processing part 11b. An inert gas supplied from the gas introduction member 12b may be one of the Ar gas and the N₂ gas.

In the independent substrate processing mode, contrary to FIG. 3B, the processing of the wafer Wb by the HF gas and the NH₃ gas may be performed in the processing part 11b, whereas the supply of the HF gas and the NH₃ gas onto the wafer Wa may be stopped in the processing part 11a. In this case, the state of the opening/closing valves 151a to 151h corresponds to, for example, "Case c" described above. At this time, the supply of the HF gas to the processing part 11a may be stopped, and the NH₃ gas may be supplied to the processing part 11a. An inert gas supplied from the gas introduction member 12a may be one of the Ar gas and the N₂ gas.

When it is desired to make a timing of the COR processing different between the processing part 11a and the processing part 11b, the independent substrate processing mode is a mode in which processing is performed in one processing part and no processing is performed in the other processing part.

Figure 4:
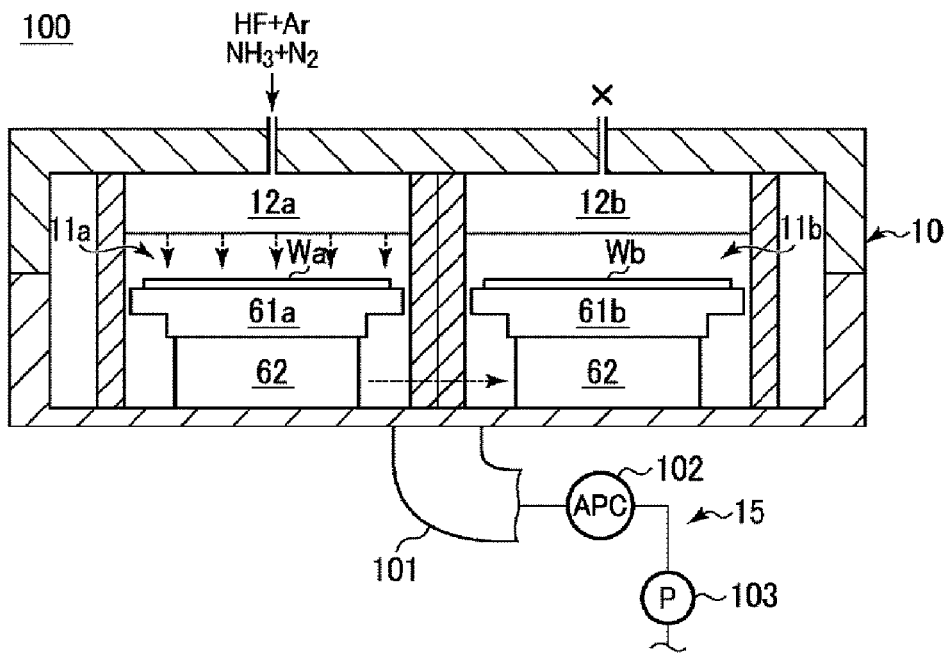
FIG. 4 is a view schematically illustrating a substrate processing mode according to a reference example.

When the independent substrate processing mode is applied in such a manner that the COR process is performed in the processing part 11b and no COR process is performed in the processing part 11b, it may be considered to stop the supply of a gas from the gas introduction member 12b to the processing part 11b, as a reference example illustrated in FIG. 4. However, since the exhaust mechanism 15 is shared by both the processing parts 11a and 11b and the pressure is controlled by the single APC, if the supply of a gas from the gas introduction member 12b is stopped while continuing to supply the HF gas and the NH₃ gas from the gas introduction member 12a, a pressure difference occurs between the processing part 11a and the processing part 11b. Therefore, even when the process spaces S of the processing parts 11a and 11b are substantially sealed, the gas from the gas introduction member 12a flows backward through slits formed in the lower portions of the inner walls 71a and 71b and flows into the processing portion 11b. This makes it difficult to completely stop the processing of the wafer Wb by the HF gas and the NH₃ gas in the processing part 11b. For this reason, in the independent substrate processing mode, the Ar gas and the N₂ gas are supplied from the gas introduction member 12b, as illustrated in FIG. 3B. However, if the flow rates of the Ar gas and the N₂ gas are equal to those in the processing part 11a, the total flow rate decreases, which also generates a pressure difference to cause a backward flow. This makes it difficult to stop the processing completely. Therefore, in the present embodiment, in the case where the processing is performed in the independent substrate processing mode, the gas supply mechanism 14 controls the flow rates of the Ar gas and the N₂ gas from the gas introduction member 12b so as to prevent a pressure difference from occurring between the processing part 11a and the processing part 11b.

For example, the control part 16 can control the gas supply mechanism so that the pressure of the processing part 11a and the pressure of the processing part 11b become equal to each other so as to prevent the pressure difference from occurring between the processing part 11a and the processing part 11b by closing the opening/closing valves 151d and 151h to stop the supply of the HF gas and the NH₃ gas to the gas introduction member 12b and increasing the flow rates of the Ar gas and the N₂ gas by means of the MFCs 150b and 150f with the opening/closing valves 151b and 151f opened. That is to say, the Ar gas and the N₂ gas are used as supplement gases for pressure regulation. As described above, in the independent substrate processing mode, the NH₃ gas may be supplied to the processing part 11b which performs no processing, but in that case, only the Ar gas may be used as the supplement gas.

In this manner, for one of the processing parts 11a and 11b, which is intended to stop the substrate process, the pressure regulation is performed by supplying an inert gas as a supplement gas for pressure regulation rather than simply stopping the supply of a processing gas. Thus, even when the exhaust of gases from both the processing parts 11a and 11b by the single exhaust mechanism 15 is performed at the same time, it is possible to prevent the inflow of gas between the processing parts 11a and 11b.

(One Example of Process Sequence)

Figure 5:
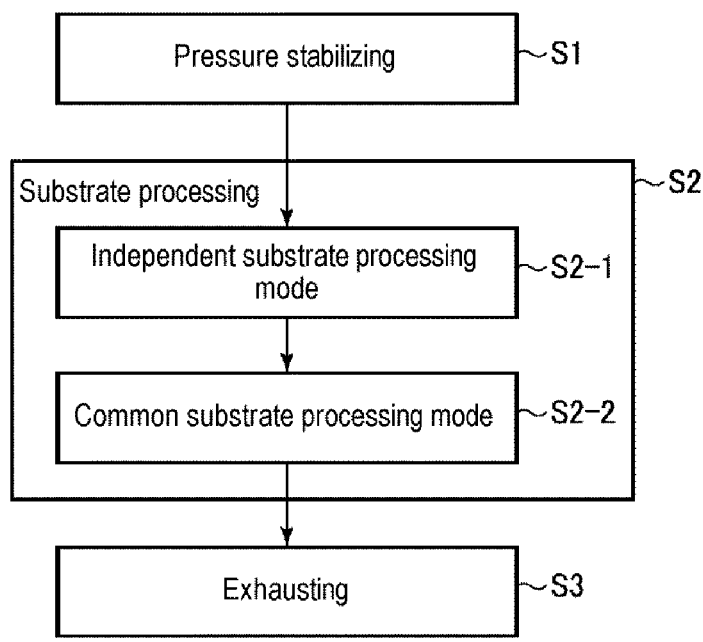
FIG. 5 is a flow chart illustrating an example of a process sequence in the substrate processing device of FIG. 1.

In this example, as illustrated in a flow chart of FIG. 5, after a pressure stabilizing step S1 for stabilizing a pressure, a substrate process step (COR process) S2 is performed in combination of the processing in the common substrate processing mode and the processing in the independent substrate processing mode, and then an exhausting step S3 for exhausting a process space is performed. In performing the substrate process step S2, the independent substrate processing mode-based process S2-1 is initially performed and subsequently the common substrate processing mode-based process S2-2 is performed.

In the substrate process step S2, when the common substrate processing mode-based process S2-2 is initially performed and the independent substrate processing mode-based process S2-1 is then performed, even if a processing gas to be supplied to a processing part in which the processing is paused is switched to a supplement gas, etching (COR process) may proceed due to a reaction product and a residual gas on the wafer when the processing is paused under high pressure conditions.

Therefore, in this example, when performing the substrate process step S2 followed by the pressure stabilizing step S1, the independent substrate processing mode-based process S2-1 is first performed and subsequently the common substrate processing mode-based process S2-2 is performed. Thus, it is possible to eliminate the influence of a reaction product and a residual gas, thereby improving the control accuracy of the etching amount.

In the transition from the independent substrate processing mode-based process S2-1 to the common substrate processing mode-based process S2-2, as described above, in the processing part 11b, the HF gas and the NH₃ gas as processing gases are introduced while the Ar gas and the N₂ gas are being supplied, or the HF gas is introduced while the Ar gas, the N₂ gas and the NH₃ gas are being supplied. As such, an etching delay may occur when the flow rate of the Ar gas or the N₂ gas is large. In such a case, a processing time may be adjusted in anticipation of the etching delay in advance.

As described above, the substrate process step S2 is ended by performing the independent substrate processing mode-based process S2-2 followed by the common substrate processing mode-based process S2-2. In some embodiments, after the common substrate processing mode-based process S2-2, the independent substrate processing mode-based process S2-1 and the common substrate processing mode-based process S2-2 may be repeated while performing a purging process between the process S2-1 and the process S2-2.

A specific gas flow control in this example will be described with reference to a timing chart of FIG. 6. First, the opening/closing valves 151a, 151b, 151e, 151f, 151g and 151h are opened so that the Ar gas, the $N_2$ gas and the $NH_3$ gas are supplied to the processing parts 11a and 11b at the predetermined same flow rates to adjust internal pressures of the processing parts 11a and 11b to a predetermined pressure, thereby stabilizing the internal pressures (in the pressure stabilizing step S1).

At the point of time when the pressure is stabilized, the substrate process is started (in the substrate process step S2). In the substrate process step S2, first, the opening/closing valve 151c is opened to supply the HF gas to the processing part 11a to start the COR process in the processing part 11a, and then the independent substrate processing mode-based process S2-1 with no COR process is performed for a predetermined period of time without supplying the HF gas to the processing part 11b. At this time, since the HF gas is not supplied to the processing part 11b, the Ar gas of the processing part 11b is increased in flow rate more than that of the processing part 11a so that the processing part 11b has the same internal pressure as the processing part 11a. The Ar gas of the increased flow rate serves as a supplement gas. The increase in amount of the Ar gas (the flow rate of the supplement gas) may correspond to the amount of the HF gas supplied to the processing part 11a.

After the predetermined period of time, the COR process is continued in the processing part 11a while maintaining all the gases at the same flow rates, and the common substrate processing mode-based process S2-2 with the COR process is performed in the processing part 11b for a predetermined period of time by opening the opening/closing valve 151d to supply the HF gas to the processing part 11b. At this time, in the processing part 11b, the flow rate of the Ar gas supplied in the independent substrate processing mode-based process S2-1 is decreased so that the processing part 11b has the same internal pressure as the processing part 11a. In this case, the decrease in the amount of the Ar gas may correspond to the amount of the HF gas supplied to the processing part 11b.

After the substrate process step S2 is completed, all the opening/closing valves are closed to stop the supply of the gases and the process spaces S are exhausted by the exhaust mechanism 15 (in the exhausting step S3).

Figure 6:
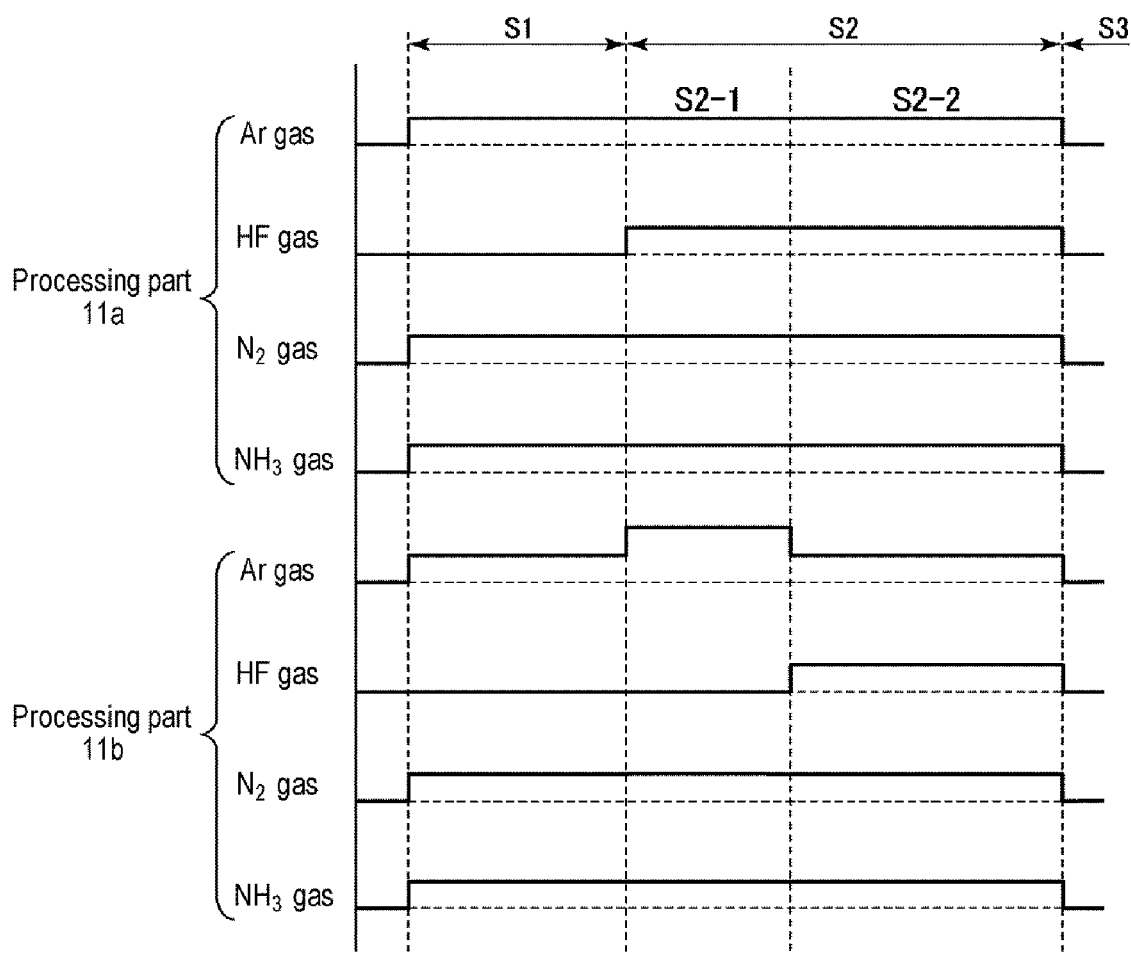
FIG. 6 is a timing chart illustrating a specific gas flow when implementing an example of a sequence in the substrate processing device of FIG. 1.

In the example of FIG. 6, the HF gas is not introduced into the processing part 11b in the independent substrate processing mode-based process S2-1, but the HF gas is introduced into the processing part 11b in the common substrate processing mode-based process S2-2. In some embodiments, the HF gas and the $NH_3$ gas may not be introduced into the processing part 11b in the independent substrate processing mode-based process S2-1, but the HF gas and the $NH_3$ gas may be introduced into the processing part 11b when switching to the common substrate processing mode-based process S2-2. In this case, in the independent substrate processing mode-based process S2-1, the supplement gases to be supplied to the processing part 11b may be the Ar gas and the $N_2$ gas.

The result of confirming the effects of the method of this example will be described. Here, etching (COR process) was performed by the processing apparatus of FIG. 1. First, a processing recipe for cyclically etching a CVD-$SiO_2$ film in 6 sec×8 cycle was used to evaluate an etching result for a case (process A) where the etching was performed in the order of the common substrate processing mode→the independent substrate processing mode in each cycle and a case (process B) where the etching was performed in the order of the independent substrate processing mode→the common substrate processing mode in each cycle. As described above, the Ar gas, the HF gas, the $N_2$ gas and the $NH_3$ gas were supplied to both the processing parts 11a and 11b to perform the COR process in the common substrate processing mode, and the COR process was performed in only the processing part 11a in the independent substrate processing mode without supplying the HF gas to the processing part 11b. That is to say, in the process A, the COR process was initially performed and subsequently the process was stopped in the processing part 11b in each cycle, whereas, in the processing B, the COR process was performed after initially stopping the process for a predetermined period of time in the processing part 11b in each cycle.

As a result, in the process A, the etching amount was +36.6% for the target, whereas, in the processing B, the etching amount was −10.4% for the target. From this fact, it was confirmed that the controllability of the etching amount is improved by initially performing the independent substrate processing mode-based process and then performing the common substrate processing mode-based process.

Next, a processing recipe for cyclically etching a thermal oxide film in 15 sec×5 cycle was used to evaluate an etching result for a case (process C) where the etching was performed in the order of the common substrate processing mode→the independent substrate processing mode in each cycle and a case (process D) where the etching was performed in the order of the independent substrate processing mode→the common substrate processing mode in each cycle.

As a result, in the process C, the etching amount was +12.7% for the target, whereas, in the process D, the etching amount was −5.0% for the target. Similarly in the thermal oxide film, from this fact, it was confirmed that the controllability of the etching amount is improved by initially performing the independent substrate processing mode-based process and then performing the common substrate processing mode-based process.

(Another Example of Process Sequence)

In the aforementioned example of the process sequence, in the independent substrate processing mode-based process S2-1, the Ar gas and the $N_2$ gas are increased to function as supplement gases in the processing part to which the processing gases (the HF gas and the $NH_3$ gas) are not supplied, so that a pressure difference is prevented from occurring between the processing part 11a and the processing part 11b. This prevents the inflow of the gases between the processing parts 11a and 11b. However, since the processing parts 11a and 11b are interconnected via the slits formed in the portions of the inner walls 71a and 71b below the substrate mounting tables 61a and 61b, it is difficult to completely prevent a backward flow of the processing gases (the HF gas and the $NH_3$ gas) from one processing part to the other processing part and completely prevent a backward flow of the supplement gases (the Ar gas and the $N_2$ gas) from the other processing part to one processing part. Thus, a backward flow of tiny amounts of gases (gas backward diffusion) occurs. When the flow rates of the processing gases are equal to or higher than a certain level, such a backward flow of tiny amounts of gases does not greatly affect the etching amount, which makes it possible to realize a process with a desired etching amount in the processing parts 11a and 11b. However, in the process of a low flow rate region, the influence of such a gas backward flow cannot be ignored and a deviation from a set etching amount becomes large, which may make it impossible to perform a desired process in the processing parts 11a and 11b independently of each other.

On the other hand, if the flow rates of the processing gases (the HF gas and the $NH_3$ gas) and the supplement gases (the Ar gas and the $N_2$ gas) are increased in order to avoid such a problem, the etching rate increases and it is therefore necessary to adjust the etching amount with the processing time and the gas flow rate, which may result in a narrow process margin.

Therefore, in this example, during the pressure stabilizing step S1, a pressure regulating gas is flowed at a sufficient flow rate to prevent the processing gases and the supplement gases from backwardly diffusing between the processing parts 11a and 11b in the independent substrate processing mode-based process S2-2 of the subsequent substrate process step S2, and to form a flow of gas flowing from the gas introducing members 12a and 12b to the exhaust mechanism 15. This effectively prevents the backward flow (backward diffusion) of gases in the low flow rate region in the independent substrate processing mode-based process S2-2 of the substrate process step S2.

Figure 7:
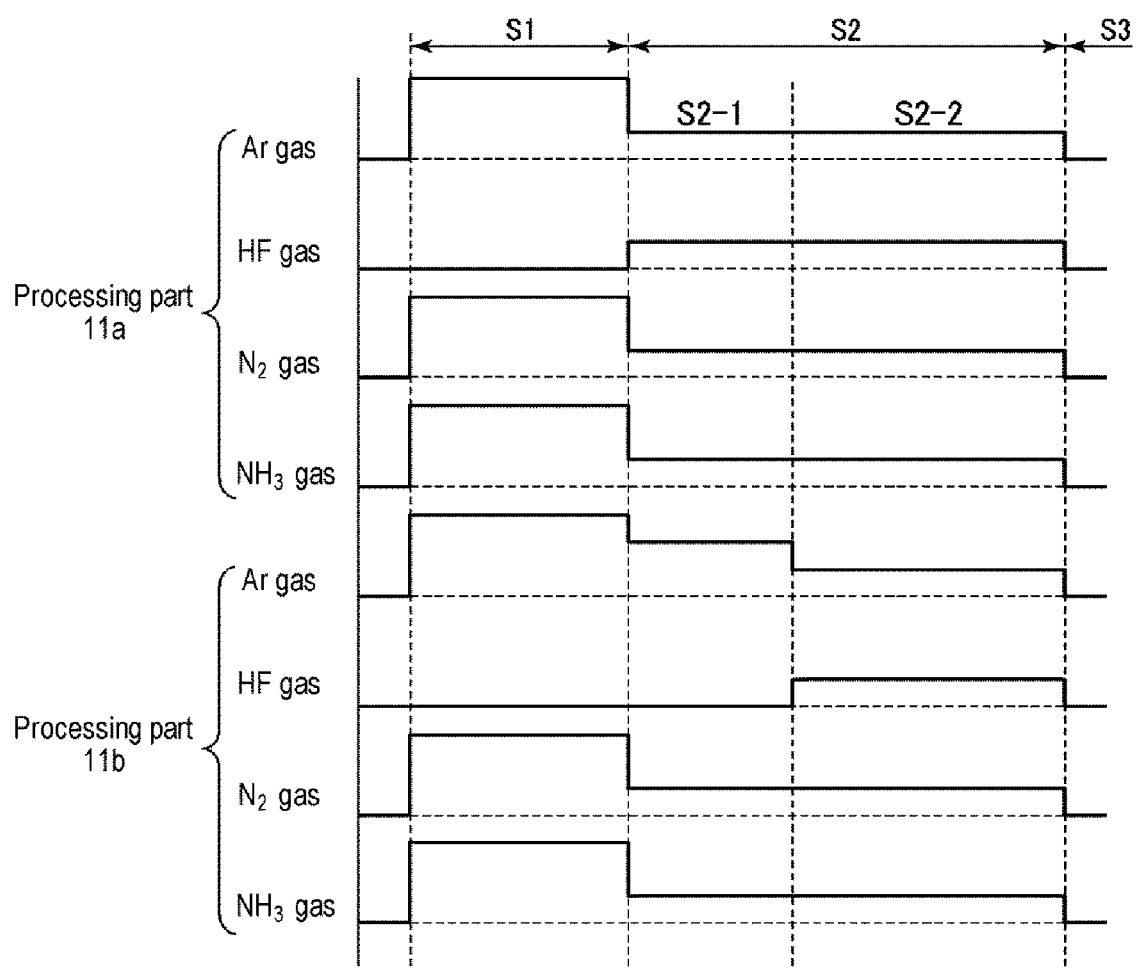
FIG. 7 is a timing chart illustrating a specific gas flow when implementing another example of the sequence in the substrate processing device of FIG. 1.

Specifically, as illustrated in a timing chart of FIG. 7, the Ar gas, the $N_2$ gas and the $NH_3$ gas are supplied as the pressure regulating gases to both the processing parts 11a and 11b during the pressure stabilizing step S1. The flow rates of the Ar gas, the $N_2$ gas and the $NH_3$ gas are set to be larger than those in the substrate process step S2. In this case, the total flow rate of the pressure regulating gases may be three times or more as large as that in the substrate process step S2. As the pressure regulating gas, a portion of the gases supplied during the substrate process step S2, which does not cause substrate process, may be used. As in the example of FIG. 6, as the pressure regulating gases, the Ar gas, the $N_2$ gas and the $NH_3$ gas may be used in the processing part 11a, and the Ar gas and the $N_2$ gas may be used in the processing part 11b.

In this example, in the subsequent substrate process step S2, in the independent substrate processing mode-based process S2-1, the flow rates of the Ar gas, the $N_2$ gas and the $NH_3$ gas are decreased until reaching a normal state, and the HF gas is supplied at a predetermined flow rate to perform the COR process in the processing part 11a, whereas the flow rates of the $N_2$ gas and the $NH_3$ gas in the processing part 11b are set to be equal to those in the processing part 11a. The supply amount of the Ar gas is adjusted so as to include a supplement gas corresponding to the HF gas supplied to the processing part 11a. In the subsequent common substrate processing mode-based process S2-2, the HF gas is also supplied to the processing part 11b, the flow rate of the Ar gas supplied as a supplement gas is reduced by the supply amount of the HF gas. Thus, the COR process is performed in the processing parts 11a and 11b under the same processing conditions. Thereafter, the supply of the gases is stopped and the exhausting step S3 is performed to exhaust the process spaces S by the exhaust mechanism 15.

Thus, in the low flow rate region, in the independent substrate processing mode-based process S2-2, it is possible to prevent the backward flow of the processing gases and the supplement gases more effectively than that in a case of only adjusting the pressure with the supplement gases. More specifically, even in the low flow rate region, it is possible to extremely effectively prevent the processing gases (the HF gas and the $NH_3$ gas) from flowing backward from the processing part 11a to the processing part 11b intended to stop the process, and also prevent the supplement gases (the Ar gas and the $N_2$ gas) from flowing backward from the processing part 11b to the processing part 11a intended to continue the process. It is therefore possible to perform the substrate process so that the etching amount is close to the etching amount set in both the processing parts 11a and 11b.

In the example of FIG. 7, the HF gas is not introduced into the processing part 11b in the independent substrate processing mode-based process S2-1, whereas the HF gas is introduced into the processing part 11b in the common substrate processing mode-based process S2-2. However, the HF gas and the $NH_3$ gas may not be introduced into the processing part 11b in the independent substrate processing mode-based process S2-1. The HF gas and the $NH_3$ gas may be introduced into the processing part 11b when switching to the common substrate processing mode-based process S2-2. In this case, in the independent substrate processing mode-based process S2-1, the supplement gases supplied to the processing part 11b may be the Ar gas and the $N_2$ gas.

Figure 8:
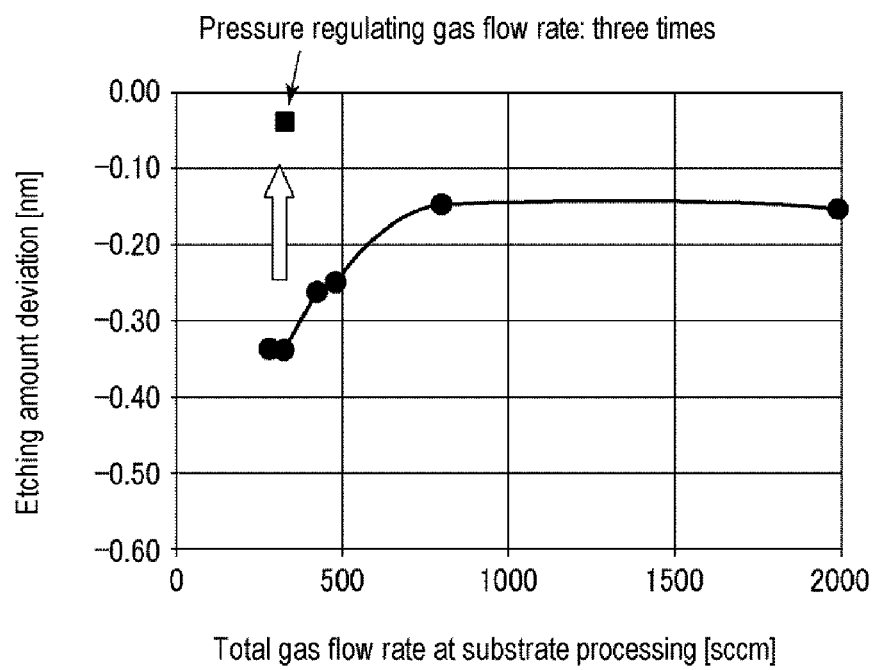
FIG. 8 is a view for explaining the effect of the sequence of FIG. 7.

The effects achieved when the flow rate of the pressure regulating gas is actually increased in the pressure stabilizing step will be described with reference to FIG. 8. Here, after performing the pressure stabilizing step using the apparatus of FIG. 1, the COR process was initially performed in the processing part 11a in the substrate process step. The HF gas was not supplied to the processing part 11b, and the independent substrate processing mode-based process was performed to supplement an Ar gas as a supplement gas at a flow rate corresponding to the amount of the not-supplied HF gas. Therefore, the COR process was performed in both the processing parts in the common substrate processing mode. FIG. 8 is a view illustrating the total gas flow rate during the substrate process step and an etching amount deviation (a difference between the actual etching amount and the set etching amount) in the COR process in the processing part 11a. In FIG. 8, a black circle indicates an etching amount deviation when the flow rates of the pressure regulating gases (the Ar gas, the $N_2$ gas and the $NH_3$ gas) in the pressure stabilizing step are set to be equal to those in the substrate process step. The etching amount deviation tends to be large in a region where the total flow rate is low. The etching amount deviation is as large as about −0.33 nm at the total flow rate of 300 sccm. On the other hand, a black square indicates an etching amount deviation available when the flow rates of the pressure regulating gases are tripled. In this case, even when the total flow rate during the substrate process step is 300 sccm, the etching amount deviation is about −0.03 nm, which is very close to the set value. The effect of increasing the flow rates of the pressure regulating gases was confirmed from this fact.

As described above, when the COR process is performed on a $SiO_2$ film formed on a wafer using the HF gas and the $NH_3$ gas, ammonium fluorosilicate (($NH_4$)$_2SiF_6$: AFS) is generated as a reaction product. Thus, the wafer processed in the COR processing apparatus 100 is heat-treated in a heat treating apparatus to decompose and remove the AFS.

As described above, according to the present embodiment, in performing the COR process on the two wafers respectively in the processing part 11a and the processing part 11b, while the exhaust mechanism 15 is used in a collective manner, the process is initially performed in only one of the processing part 11a and the processing part 11b in the independent substrate processing mode, and subsequently, the COR process is performed in the processing parts in the common substrate processing mode under the same conditions. This improves the controllability of the etching amount.

<Other Applications>

Although the present disclosure has been described by way of an embodiment, the present disclosure is not limited to the above embodiment but various modifications can be made without departing from the spirit and scope of the present disclosure.

While in the above embodiment, the HF gas and the $NH_3$ gas have been described to be used to perform the COR process, the COR process may be performed with only the HF gas or the $NH_3$ gas by the substrate processing device of FIG. 1. For example, in a case in which an HF gas diluted with an Ar gas is supplied to perform the COR process, the opening/closing valves may be controlled as shown in the following Case d. Specifically, the independent substrate processing mode-based process may be performed using the HF gas only in the processing part 11a. Subsequently, with the opening/closing valves 151e, 151f, 151g and 151h closed, the opening/closing valves 151a, 151b, 151c and 151d may be opened to supply the HF gas and the Ar gas to perform the common substrate processing mode-based process.

[Cased]
Supply System to Gas Introduction Member 12a

| | |
|---|---|
| Opening/closing valve 151a (Ar) | Opened |
| Opening/closing valve 151c (HF) | Opened |
| Opening/closing valve 151e ($N_2$) | Closed |
| Opening/closing valve 151g ($NH_3$) | Closed |

Supply System to Gas Introduction Member 12b

| | |
|---|---|
| Opening/closing valve 151b (Ar) | Opened |
| Opening/closing valve 151d (HF) | Closed |
| Opening/closing valve 151f ($N_2$) | Closed |
| Opening/closing valve 151h ($NH_3$) | Closed |

Figure 9:
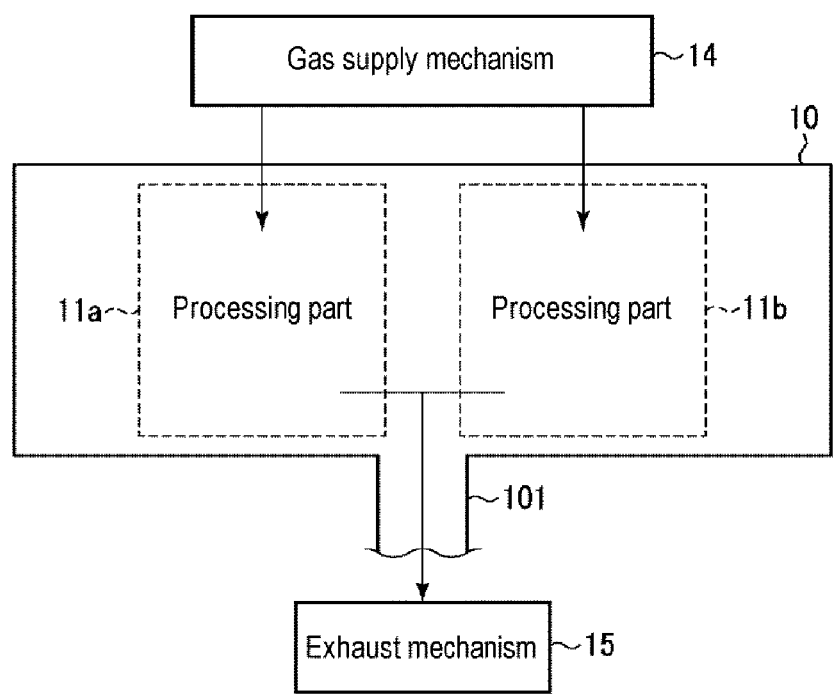
FIG. 9 is a view schematically illustrating an example of a chamber configuration of a substrate processing device.

In addition, the substrate processing device is not limited to the COR processing apparatus 100 of FIG. 1 as long as it is schematically configured as illustrated in FIG. 9 such that the processing parts 11a and 11b are installed in a single common chamber 10 and the exhaust mechanism 15 is shared by the processing parts 11a and 11b installed inside the single common chamber 10.

Figure 10:
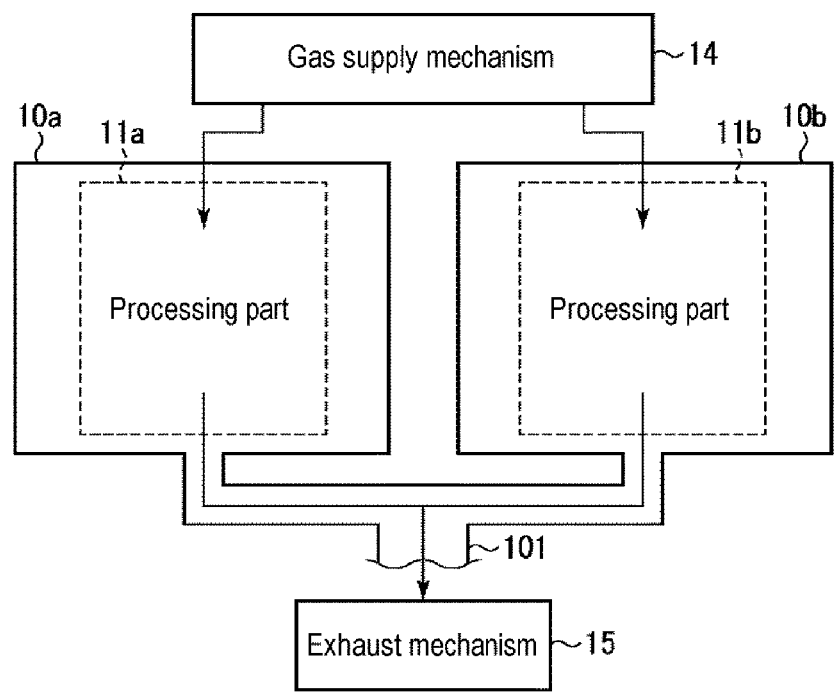
FIG. 10 is a view schematically illustrating another example of the chamber configuration of the substrate processing device.

Further, the present disclosure is limited to the configuration of FIG. 9 where the processing parts 11a and 11b are installed inside the single common chamber 10. As an example, as illustrated in FIG. 10, the processing parts 11a and 11b may be respectively installed inside separate chambers 10a and 10b, and the exhaust mechanism 15 may be shared by the separate chambers 10a and 10b.

While in the above embodiment, the Ar gas or the $N_2$ gas, which is a dilution gas for diluting the processing gas such as the HF gas or the $NH_3$ gas, is used as a supplement gas for pressure regulation, but the present disclosure is limited to thereto. As an example, the supplement gas may be another inert gas. In addition, the supplement gas for pressure regulation is not limited to the inert gas but may be a non-reactive gas which is not reactive with etching target films of processed wafers Wa and Wb. Further, a reactive gas may be used as long as it can regulate the pressure without affecting the process.

In the above embodiment, the dilution gas is used as a supplement gas for pressure regulation together with the processing gas during the substrate process. However, separately from the dilution gas used together with the processing gas, a dedicated supplement gas may be used. In this case, a dedicated supplement gas supply source, a dedicated supplement gas supply pipe and dedicated MFCs and dedicated opening/closing valves may be additionally installed in the gas supply mechanism 14.

Further, in the above embodiment, a semiconductor wafer has been described as an example of a target substrate. However, it is obvious that the target substrate is not limited to the semiconductor wafer in the principle of the present disclosure and it is to be understood that it can be applied to different various substrate processes.

Furthermore, in the above embodiment, the apparatus provided with the two processing parts 11a and 11b as a plurality of processing parts has been described as an example, but the number of processing parts is not limited to two.

Moreover, in the above embodiment, the substrate processing device of the present disclosure has been described to be applied as the COR processing apparatus, but the substrate processing device is not limited to the COR processing apparatus.

EXPLANATION OF REFERENCE NUMERALS 10, 10a, 10b: chamber, 11a, 11b: processing part, 12a, 12b: gas introduction member, 14: gas supply mechanism, 15: exhaust mechanism, 16: control part, 71a, 71b: inner wall, 101: exhaust pipe, 141: Ar gas supply source, 142: HF gas supply source, 143: $N_2$ gas supply source, 144: $NH_3$ gas supply source, 145, 145a, 145b: HF gas supply pipe, 146a, 146b: supply pipe, 147, 147a, 147b: Ar gas supply pipe, 148, 148a, 148b: $NH_3$ gas supply pipe, 149, 149a, 149b: $N_2$ gas supply pipe, 150a to 150h: mass flow controller, 151a to 151h: opening/closing valve

What is claimed is:

1. A substrate processing method for performing a predetermined process on a plurality of target substrates under a vacuum atmosphere using a substrate processing device that includes a plurality of processing parts for performing a substrate process on each of the plurality of target substrates, a gas supply mechanism for separately supplying gases to the plurality of processing parts, and a common exhaust mechanism for exhausting the gases inside the plurality of processing parts in a collective manner, the method comprising:
    performing a first mode while controlling the common exhaust mechanism so as to exhaust a processing gas in common from the plurality of processing parts; and
    subsequently, performing a second mode in which a first gas as the processing gas is supplied to all of the plurality of processing parts under the same gas conditions, while exhausting the processing gas from the plurality of processing parts in a collective manner by the common exhaust mechanism,
    wherein, in the first mode, a pressure difference is prevented from occurring between the plurality of processing parts, and
    wherein, when performing the first mode,
        in a portion of the plurality of processing parts, the substrate process is performed with the first gas which is the processing gas for the plurality of target substrates; and
        in another portion of the plurality of processing parts, the first gas which is the processing gas for the plurality of target substrates is not supplied, a second gas is supplied as a supplement gas, and the substrate process is not performed.

2. The substrate processing method of claim 1, wherein the performing a first mode includes controlling an amount of the second gas supplied to the another portion of the plurality of processing parts so as to prevent the pressure difference from occurring between the portion of the plurality of processing parts and the another portion of the plurality of processing parts.

3. The substrate processing method of claim 1, wherein the second gas is at least one of an inert gas and a non-reactive gas that is not reactive with the plurality of target substrates.

4. The substrate processing method of claim 1, wherein a dilution gas for diluting the first gas is used as the second gas.

5. The substrate processing method of claim 1, further comprising: prior to the performing a first mode, stabilizing pressures of the plurality of processing parts by regulating the pressures of the plurality of processing parts with a pressure regulating gas,
wherein the stabilizing pressures includes setting a flow rate of the pressure regulating gas to a level at which the first gas used as the processing gas and the second gas used as the supplement gas are suppressed from backwardly diffusing between the plurality of processing parts, and a flow of the pressure regulating gas toward the common exhaust mechanism is formed, in the first mode of the substrate process.

6. The substrate processing method of claim 5, wherein a portion of the first gas or the second gas supplied during the substrate process, which is not used for the substrate process, is used as the pressure regulating gas, and the flow rate of the pressure regulating gas in the stabilizing pressures is set to be larger than a flow rate of the pressure regulating gas used in the substrate process.

7. The substrate processing method of claim 6, wherein the flow rate of the pressure regulating gas in the stabilizing pressures is set to be three times or more the flow rate of the pressure regulating gas used in the substrate process.

8. A substrate processing method for performing a predetermined process on a plurality of target substrates under a vacuum atmosphere using a substrate processing device that includes a plurality of processing parts for performing a substrate process on each of the plurality of target substrates, a gas supply mechanism for separately supplying gases to the plurality of processing parts, and a common exhaust mechanism for exhausting the gases inside the plurality of processing parts in a collective manner, the method comprising:
performing a first mode in which an HF gas and an NH$_3$ gas as processing gases are supplied to a portion of the plurality of processing parts so as to perform an etching process, and instead of the HF gas, an inert gas and/or a non-reactive gas which is not reactive with the plurality of target substrates is supplied to another portion of the plurality of processing parts so as not to perform the etching process, while controlling the common exhaust mechanism so as to exhaust the processing gases from the plurality of processing parts in a collective manner by the common exhaust mechanism; and
subsequently, performing a second mode in which the HF gas and the NH$_3$ gas as the processing gases are supplied to all of the plurality of processing parts so as to perform the etching process, while controlling the common exhaust mechanism so as to exhaust the processing gases in common from the plurality of processing parts,
wherein, in the first mode, the supply of a mixed gas of the HF gas and the NH$_3$ gas or a mixed gas of the inert gas and/or the non-reactive gas is performed to prevent a pressure difference from occurring between the plurality of processing parts.

9. The substrate processing method of claim 8, wherein the performing a first mode includes supplying the HF gas and the NH$_3$ gas as the processing gases and the inert gas to the portion of the plurality of processing parts, and supplying the inert gas or the inert gas and the NH$_3$ gas to the another portion of the plurality of processing parts,
wherein the inert gas is used as a supplement gas for regulating pressures of the portion of the plurality of processing parts and the another portion of the plurality of processing parts.

10. The substrate processing method of claim 9, further comprising: prior to the performing a first mode, stabilizing pressures of the plurality of processing parts by regulating the pressures of the plurality of processing parts with the inert gas or the inert gas and the NH$_3$ gas as pressure regulating gases,
wherein the stabilizing pressures includes setting flow rates of the pressure regulating gases to a level at which the processing gases and the inert gas are suppressed from backwardly diffusing between the plurality of processing parts, and a flow of the pressure regulating gases toward the common exhaust mechanism is formed, in the first mode of the substrate process.

11. The substrate processing method of claim 10, wherein the flow rates of the pressure regulating gases in the stabilizing pressures are set to be larger than flow rates of the pressure regulating gas used in the substrate process.

12. The substrate processing method of claim 11, wherein the flow rates of the pressure regulating gases in the stabilizing pressures are set to be three times or more the flow rates used in the substrate process.

* * * * *